United States Patent
Leung et al.

(10) Patent No.: US 6,185,711 B1
(45) Date of Patent: Feb. 6, 2001

(54) METHODS AND APPARATUS FOR SYNCHRONIZING ASYNCHRONOUS TEST STRUCTURES AND ELIMINATING CLOCK SKEW CONSIDERATIONS

(75) Inventors: Arthur T. Leung, Sunnyvale; Dale Greenley, Los Gatos, both of CA (US)

(73) Assignee: Sun Microsystems, Inc., Palo Alto, CA (US)

(*) Notice: Under 35 U.S.C. 154(b), the term of this patent shall be extended for 0 days.

(21) Appl. No.: 09/204,557

(22) Filed: Dec. 3, 1998

(51) Int. Cl.7 ............................................. G06F 11/00
(52) U.S. Cl. ..................... 714/731; 714/724; 714/707
(58) Field of Search ................................. 714/731, 724, 714/707

(56) References Cited

U.S. PATENT DOCUMENTS

| | | | |
|---|---|---|---|
| 5,381,420 | 1/1995 | Henry | 371/22.3 |
| 5,434,804 * | 7/1995 | Bock et al. | 702/117 |
| 5,444,667 * | 8/1995 | Obara | 365/233 |
| 5,524,098 * | 6/1996 | Holland et al. | 365/219 |
| 5,617,367 * | 4/1997 | Holland et al. | 365/219 |
| 5,717,702 | 2/1998 | Stokes et al. | 371/22.35 |
| 5,898,331 * | 4/1999 | Fujita | 327/296 |
| 5,898,702 * | 4/1999 | Narayanan et al. | 714/726 |
| 6,075,749 * | 6/2000 | Isa | 365/233 |

* cited by examiner

Primary Examiner—Phung M. Chung
(74) Attorney, Agent, or Firm—Finnegan, Henderson, Farabow, Garrett & Dunner, L.L.P.

(57) ABSTRACT

A synchronizing circuit receives an external signal and yields an output that is synchronized with the system clock and operates at the frequency of the external signal. The signal output from the synchronizing circuit is fed into the clock-enable input of the storage element, and the system clock signal is fed into the clock input of the storage element. Because the clock-enable signal triggers the storage element, the storage element is driven at the external signal frequency. Clock skew is eliminated because the system clock used for the clock input to the storage element is skew-controlled.

22 Claims, 7 Drawing Sheets

METHODS AND APPARATUS FOR SYNCHRONIZING ASYNCHRONOUS TEST STRUCTURES AND ELIMINATING CLOCK SKEW CONSIDERATIONS

BACKGROUND OF THE INVENTION

A. Field of the Invention

This invention generally relates to circuit testing, and, more particularly, to methods and apparatus for synchronizing asynchronous test structures and eliminating clock skew considerations.

B. Description of the Related Art

Advances in technology, such as complex integrated circuits (ICs) that use surface mount technology, have made traditional in-circuit testing methods extremely difficult. One approach for testing complex ICs is by using the Joint Test Action Group (JTAG) standard, which was developed by an international group of electronic manufacturers. This standard has been adopted by the Institute of Electrical and Electronic Engineers (IEEE) as IEEE Standard 1149.1–1990, IEEE Standard Test Access Port and Boundary-Scan Architecture (the "IEEE standard"), the contents of which are hereby incorporated by reference.

The JTAG standard is frequently used for boundary scan testing, which allows testing based on an IC's inputs and outputs. The JTAG standard, however, may also be used to test the core logic of an IC. Typically, this is done by serially connecting the core logic's storage elements to form a scan path. Using a JTAG controller in conjunction with this scan path, one can input or output data contained in the storage elements in a fashion similar to that of a shift register. These procedures are frequently called scanning information into or out of the storage elements.

One problem with using the JTAG standard for testing core logic, however, is that the JTAG standard is invasive. Because data is entered or outputted serially from one storage element to another, the data originally contained in those storage elements is altered in the process.

One approach for overcoming this problem is to employ a series of secondary storage elements that duplicate, or take a "snapshot" of, the information in the core logic's primary storage elements. These secondary storage elements may then be connected together to form a separate, independently-addressable scan path (the secondary scan path). The information contained in the primary storage elements can then be scanned out via the secondary scan path without altering the primary storage elements. This secondary scan system allows an IC to remain operational while a snapshot of the core logic information is scanned out.

For this system to comply with the JTAG standard, the secondary storage elements in the secondary scan path must be driven based on an external clock signal, referred herein as TCK. This creates two significant problems. First, the core logic's primary storage elements are driven by a system clock that is not synchronized with the TCK and that typically operates at a much higher speed than does the TCK. If the two clock signals are not synchronized, the secondary scan system will not work and there is a chance that the IC may be damaged. Second, the TCK signal is not skew-controlled, which could result in races and metastability between the secondary storage elements. Although it may be possible to create a skew-controlled clock grid for the TCK signal, doing so would be difficult and expensive.

There exists, therefore, a need to synchronize an external clock signal (such as the TCK signal) used to drive secondary storage elements with the system clock signal used by an IC's primary storage elements, and to control skewing of the external clock signal.

SUMMARY OF THE INVENTION

In accordance with the present invention, as embodied and broadly described herein, a method of driving a storage element based on unsynchronized external signals that are not skew-controlled, in an environment having a synchronized, skew-controlled system clock signal, comprises receiving an external clock-enable signal. This signal is synchronized to the system clock signal and transmitted to the clock-enable input of the storage element. Meanwhile, the system clock signal is received at a clock input of the storage element.

In accordance with the invention, an apparatus for driving an edge-triggered storage element based on unsynchronized external signals that are not skew-controlled, in an environment having a synchronized, skew-controlled system clock signal, comprises a synchronizing circuit and an edge-triggered storage element. The synchronizing circuit has a first input connected to an external clock-enable signal, a second input connected to the system clock signal, and an output. The edge-triggered storage element has a clock-enable input connected to the output of the synchronizing circuit, a clock input connected to the system clock signal, and an output.

In accordance with the invention, a system for driving an edge-triggered secondary storage element based on unsynchronized external signals that are not skew-controlled, in an environment having a synchronized, skew-controlled system clock signal comprises a primary storage element, an edge-triggered secondary storage element, and a synchronizing circuit. The primary storage element stores data and has an output. The edge-triggered secondary storage element has an input connected to the output of the primary storage element, a clock input connected to the system clock, and a clock-enable input. The synchronizing circuit has a first input connected to an external clock-enable signal, a second input connected to the system clock signal, and an output connected to the clock-enable input of the edge-triggered secondary storage element.

It is to be understood that both the foregoing general description and following detailed description are intended only to exemplify and explain the invention as claimed.

BRIEF DESCRIPTION OF THE DRAWINGS

The accompanying drawings, which are incorporated in and constitute a part of this specification, illustrate embodiments of the invention and, together with the description, serve to explain the advantages and principles of the invention. In the drawings.

DETAILED DESCRIPTION

The invention will now be described in reference to the accompanying drawings. The same reference numbers may be used throughout the drawings and the following description to refer to the same or like parts.

A. Overview

Methods and apparatus consistent with the present invention provide a way to drive a storage element at an external clock rate that is synchronized with the system clock and that does not suffer from clock skew problems. Clock skew problems are eliminated by using the skew-controlled system clock signal as the clock input of the secondary element. This obviates the need for a separate, skew-controlled TCK or JTAG signal. Furthermore, the secondary element is synchronized with the system clock signal and operates at the frequency of the TCK or JTAG signal.

More specifically, a synchronizing circuit receives an external signal and yields an output that is synchronized with the system clock and operates at the frequency of the external signal. The signal output from the synchronizing circuit is fed into the clock-enable input of the storage element, and the system clock signal is fed into the clock input of the storage element. Because the clock-enable signal triggers the storage element, the storage element is driven at the external signal frequency. Clock skew is eliminated because the system clock used for the clock input to the storage element is skew-controlled.

B. Architecture

Figure 1:
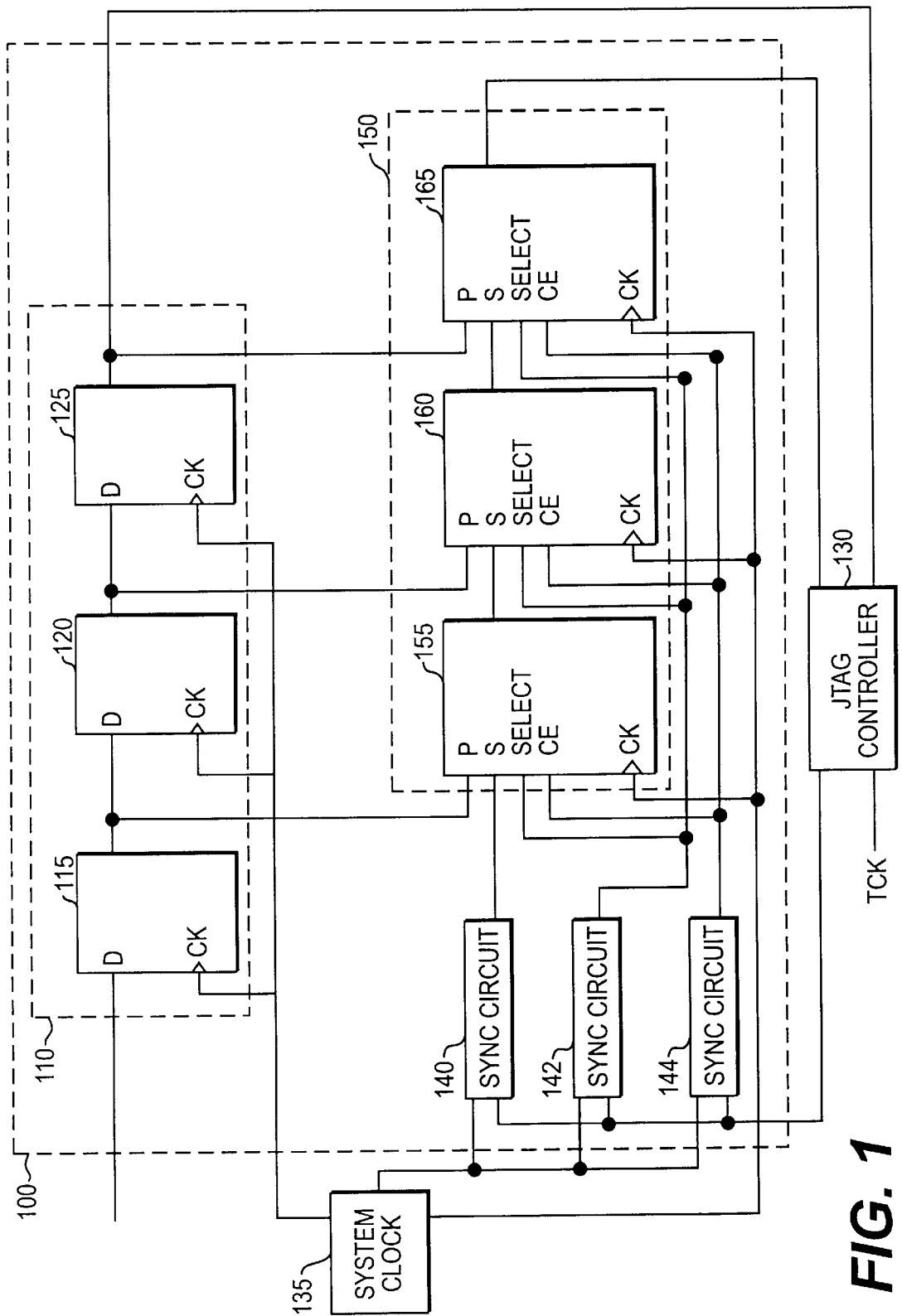
FIG. 1 is a block diagram depicting a system consistent with the invention.

FIG. 1 is a block diagram depicting a system consistent with the invention. System 100 comprises a primary scan path 110, a secondary scan path 150, and synchronizing circuits 140, 142, and 144. In one embodiment, primary scan path 110 comprises primary storage elements ("primary elements") 115, 120, and 125, and secondary scan path 150 comprises secondary storage elements ("secondary elements") 155, 160, and 165. System 100 is interfaced to a system clock 135 and a JTAG controller 130.

Primary elements 115, 120, and 125 store data used by the IC's core logic. In a preferred embodiment, primary elements 115, 120, and 125 comprise edge-triggered flip flops with a data input ("D") and a clock input ("CK"), such as D-type flip flops. Secondary elements 155, 160, and 165 store data either from one of the primary storage elements (e.g., they take a snapshot of the data contained in the primary storage elements) or from a preceding secondary element in the chain. In a preferred embodiment, secondary elements 155, 160, and 165 comprise edge-triggered flip flops with two data inputs ("P" and "S"), a Select input, a clock-enable (CE) input, and a clock input ("CK"), such as mux-2 D-type flip flops with clock enable. The secondary storage elements receive data from primary storage elements via the P inputs, receive data from preceding secondary element via the S inputs, and a Select input chooses one of the two.

JTAG controller 130 may be connected, via synchronizing circuit 140, to an S input of the first secondary element in secondary scan path 150 (namely, secondary element 155). The P inputs of secondary elements 155, 160, and 165 are connected to the data outputs of primary elements 115, 120, and 125, respectively. The S inputs of secondary elements 160 and 165 are connected to the data outputs of the preceding secondary elements in secondary scan path 150—namely, secondary elements 155 and 160, respectively. The data output of the last secondary element in secondary scan path 150 (secondary element 165) is connected to JTAG controller 130.

System clock 135 is connected to the clock input of primary elements 115, 120, and 125, and secondary elements 155, 160, and 165. System clock 135 and JTAG controller 130 are connected to inputs of synchronizing circuits 140, 142, and 144. An output from synchronizing circuit 142 is connected to the Select input of secondary elements 155, 160 and 165. An output from synchronizing circuit 144 is connected to the CE input of 155, 160 and 165. An output of synchronizing circuit 140 may also be connected to the S input of the first secondary element in secondary scan path 150, namely secondary element 155.

JTAG controller 130 is well defined in the JTAG standard and preferably issues commands to either the primary or secondary storage elements via synchronizing circuits 140, 142, and 144. In a preferred embodiment, synchronizing circuits 140, 142, and 144 contain similar structure and perform similar functions. These commands may include a Scan In signal, a Select signal, or a clock-enable signal, respectively. System clock 135 outputs a skew-controlled clock signal that is used by many components of the system, such as the logic elements of the core logic. Synchronizing circuits 140, 142, and 144 receive inputs from system clock 135 and JTAG controller 130, and provide outputs that are synchronized to system clock 135 and operates at the frequency of the signal from JTAG controller 130.

Figure 2:
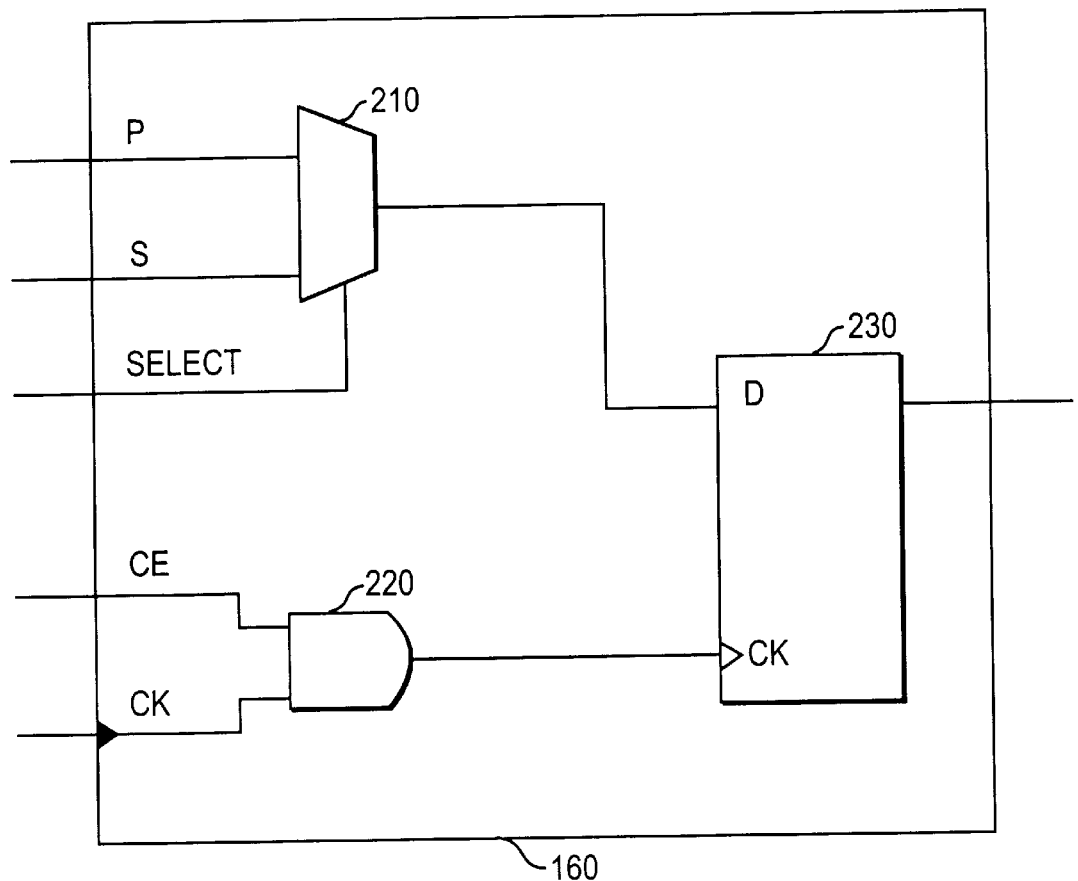
FIG. 2 is a block diagram depicting secondary storage element 160 of the system shown in FIG. 1.

FIG. 2 is a block diagram depicting a detailed view of one implementation of secondary element 160. As explained above, in a preferred embodiment, secondary element 160 is an edge-triggered flip flop with clock enable, such as a mux-2 flop with clock enable. Secondary element 160 preferably contains a multiplexor 210, an AND gate 220, and a D-type flip-flop 230.

Multiplexor 210 has a first input, a second input, a Select input, and an output. Flip flop 230 has a D input connected to the output of multiplexor 210, a clock input, and an output. AND gate 220 has first and second inputs, and an output connected to the clock input of flip flop 230.

Multiplexor 210 may be used to select, as an input to flip flop 230, either data from a primary element (e.g., from primary element 115) or data from a preceding secondary element in secondary scan path 150 (e.g., from secondary element 155). This may be accomplished by connecting the first input of multiplexor 210 to primary element 115, connecting the second input of multiplexor 210 to secondary element 155, and connecting the Select input of multiplexor 210 to an output of synchronizing circuit 142.

AND gate 220 may be used to activate flip flop 230 whenever the value of both the clock-enable (CE) signal (from synchronizing circuit 144) and the system clock signal (from system clock 135) have a logic value of "1." This may be accomplished by connecting the first input of AND gate 220 to system clock 135 and connecting the second input of AND gate 220 to a clock-enable output from synchronizing circuit 144.

Figure 3:
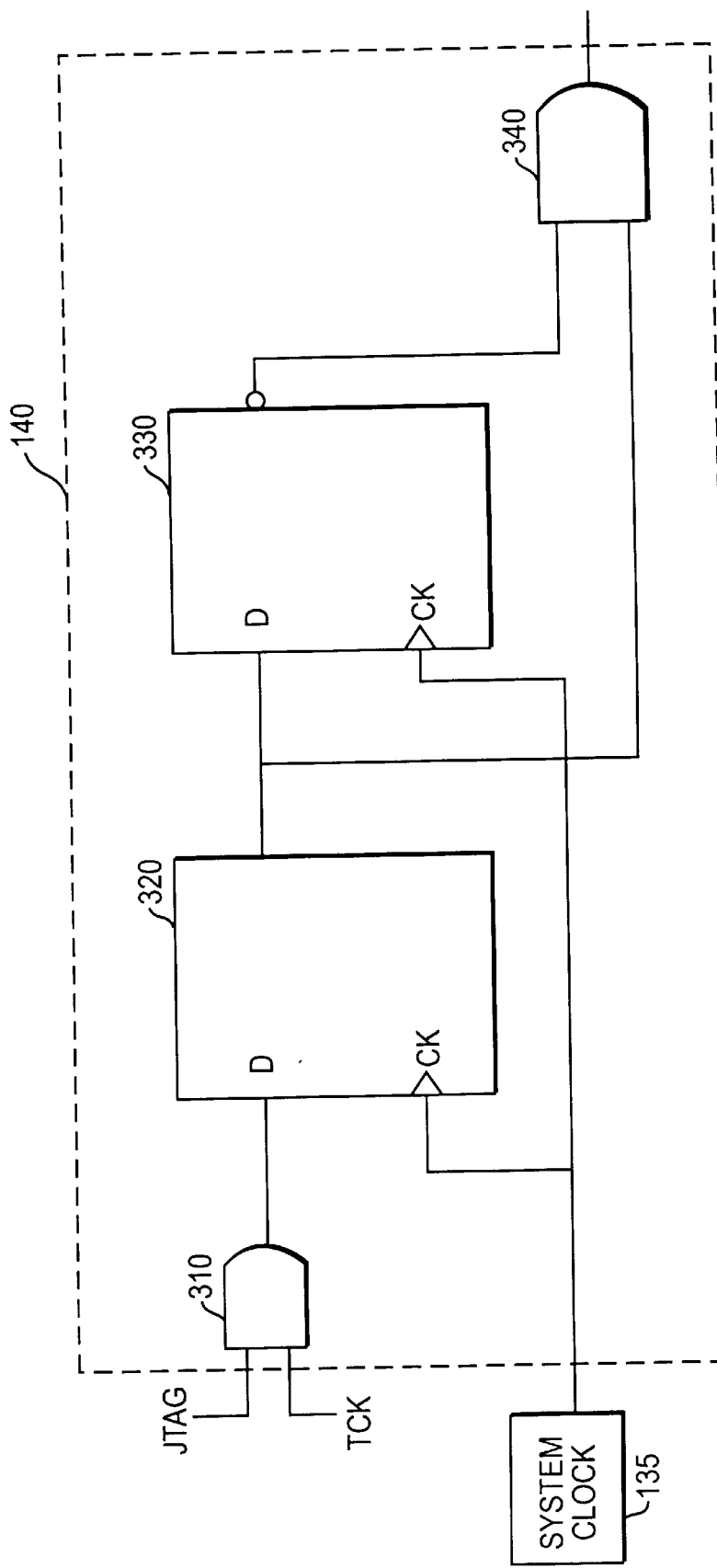
FIG. 3 is a block diagram depicting a first implementation of synchronizing circuit 140 of the system shown in FIG. 1.

FIG. 3 is a block diagram showing a first implementation of synchronizing circuit 140, consistent with the invention. This implementation may also be used for synchronizing circuits 142 and 144. Synchronizing circuit 140 comprises AND gates 310 and 340, and two storage elements 320 and 330. In a preferred embodiment, AND gate 310 has a first input connected to a signal from JTAG controller 130, a second input connected to a TCK signal, and an output. The signal from JTAG controller 130 may be either a Scan In signal, a Select signal, or a clock-enable signal. The output of AND gate 310 is a logic value "1" when both of its inputs have a logic value "1", and a logic value "0" otherwise.

The output of AND gate 310 is connected to an input of storage element 320. In a preferred embodiment, storage element 320 is an edge-triggered flip flop (such as a D-type flip flop) and has a D input connected to an output of AND gate 310, a clock input connected to system clock 135, and an output. When a rising edge of a signal from system clock 135 occurs, storage element 320 stores the value that existed at its input immediately before the rising edge of the signal from system clock 135.

An output of storage element 320 is connected to an input of storage element 330. In a preferred embodiment, storage element 330 is an edge-triggered flip flop (such as a D-type flip flop) and has a D input connected to the output signal of storage element 320, a clock input connected to system clock 135, an output, and an inverted output. When a rising edge of a signal from system clock 135 occurs, storage element 330 stores the value that existed at its input immediately before the rising edge of the signal from system clock 135.

In a preferred embodiment, the output of storage element 320 and an inverted output of storage element 330 are connected to first and second inputs of AND gate 340. AND gate 340 has an output that has a logic value "1" when both of its inputs have a logic value "1", and a logic value "0" otherwise. The output of AND gate 340 is a signal that is synchronized with system clock 135 and has a frequency equal to the TCK frequency if the signal from JTAG controller 130 is held at a logic value "1".

Figure 4:
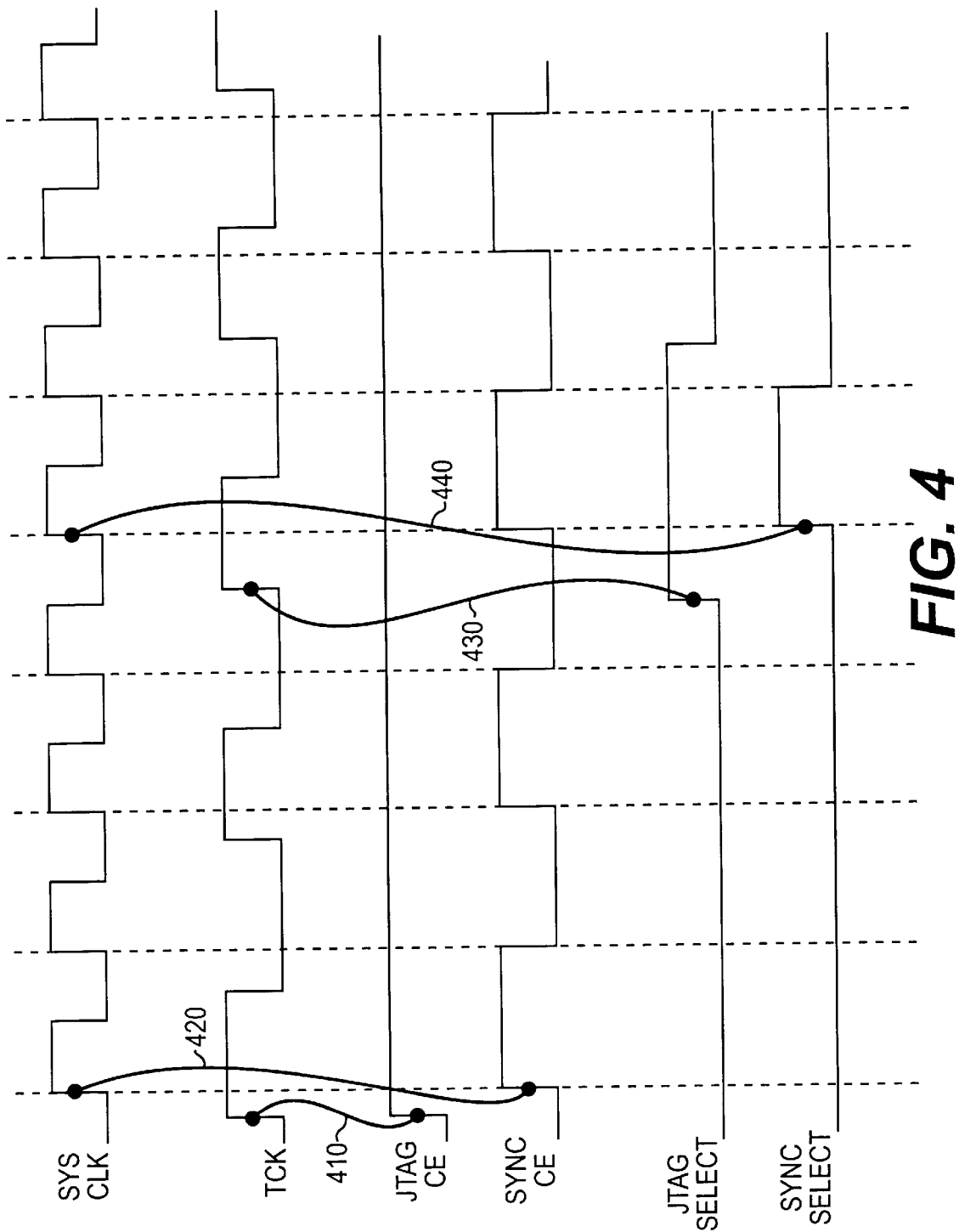
FIG. 4 is a timing diagram depicting signals associated with synchronizing circuit 140 shown in FIG. 3.

FIG. 4 is timing diagram depicting signals associated with synchronizing circuits 142 and 144 implemented as shown in FIG. 3. SYS CLK represents the signal from system clock 135. TCK represents the external TCK signal required by the JTAG standard.

JTAG CE represents a signal sent from JTAG controller 130 and received at AND gate 310 of synchronizing circuit 144 to enable a secondary element. Because JTAG CE is formed using logic (not shown) that is driven by TCK (at the TCK rate), JTAG CE is synchronized with TCK, as shown for example at 410. SYNC CE represents the output of AND gate 340 (in synchronizing circuit 144) and is a clock-enable signal that is synchronized with SYS CLK, as shown for example at 420. In a preferred embodiment, as shown in FIG. 4, JTAG CE is held at a logic value of "1." This results in a SYNC CE signal that corresponds to a version of TCK that is synchronized with SYS CLK. As explained above in reference to FIG. 1, the SYNC CE signal is transmitted to the clock-enable (CE) input of a secondary element.

JTAG SELECT represents a signal sent from JTAG controller 130 and received at AND gate 310 of synchronizing circuit 142 to sample data from a preceding secondary element. Because JTAG SELECT is formed using logic (not shown) that is driven by TCK (at the TCK rate), JTAG SELECT is synchronized with TCK, as shown for example at 430. SYNC SELECT represents the output of AND gate 340 (in synchronizing circuit 142) and is synchronized with SYS CLK. As explained above in reference to FIG. 1, the SYNC SELECT signal is transmitted to the Select input of a secondary element.

Figure 5:
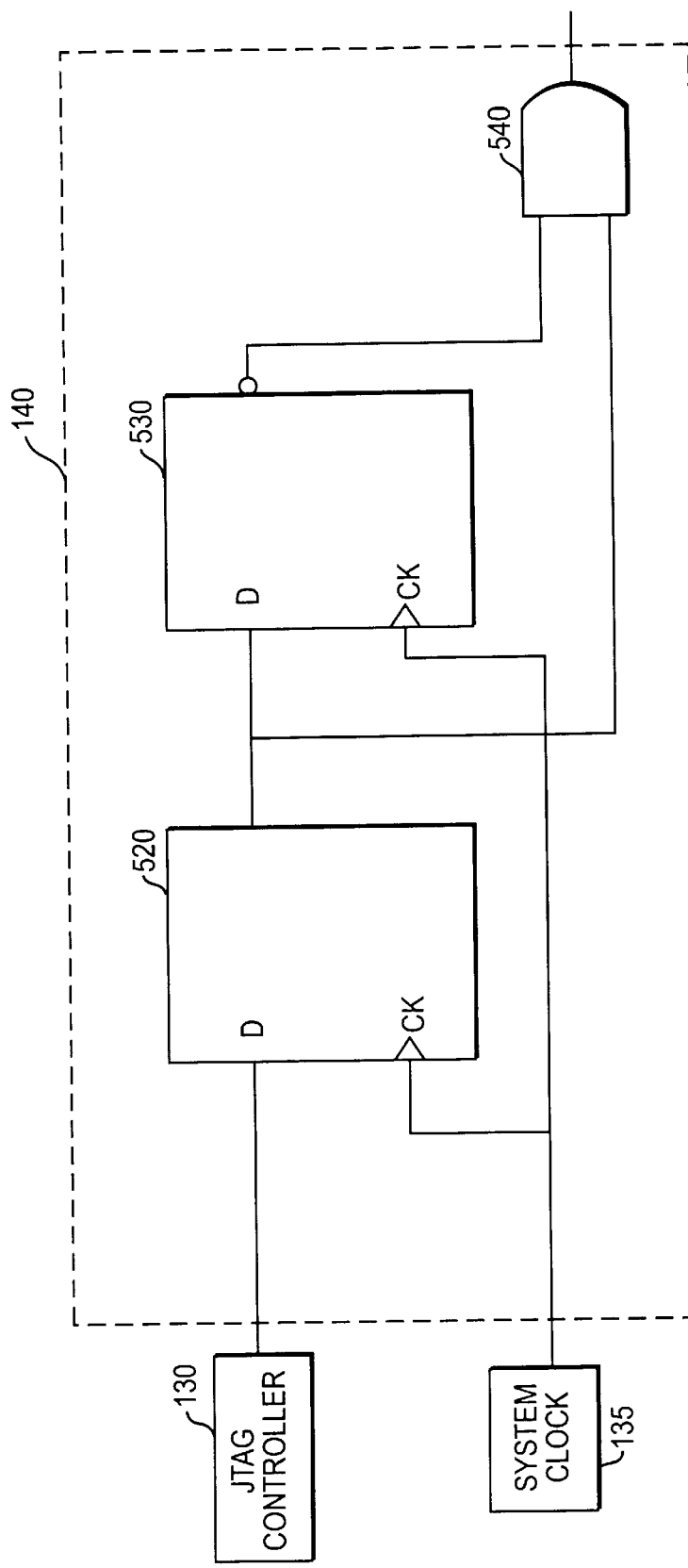
FIG. 5 is a block diagram depicting a second implementation of synchronizing circuit 140 of the system shown in FIG. 1.

FIG. 5 is a block diagram showing a second implementation of synchronizing circuit 140, consistent with the invention. This implementation may also be used for synchronizing circuits 142 and 144. In this implementation, synchronizing circuit 140 comprises two storage elements 520 and 530, and AND gate 540. In a preferred embodiment, storage element 520 is an edge-triggered flip flop (such as a D-type flip flop) and has a D input connected to a signal from JTAG controller 130, a clock input connected to system clock 135, and an output. The signal from JTAG controller may be either a Scan In signal, a Select signal, or a clock-enable signal. When a rising edge of a signal from system clock 135 occurs, storage element 520 stores the value that existed at its input immediately before the rising edge of the signal from system clock 135.

An output of storage element 520 is connected to an input of storage element 530. In a preferred embodiment, storage element 530 is an edge-triggered flip flop (such as a D-type flip flop) and has a D input connected to the output signal of storage element 520, a clock input connected to system clock 135, an output, and an inverted output. When arising edge of a signal from system clock 135 occurs, storage element 530 stores the value that existed at its input immediately before the rising edge of the signal from system clock 135.

In a preferred embodiment, the output of storage element 520 and an inverted output of storage element 530 are connected to first and second inputs of AND gate 540. AND gate 540 has an output that has a logic value "1" when both of its inputs have a logic value "1", and a logic value "0" otherwise. The output of AND gate 540 is a signal that is synchronized with system clock 135 and has a frequency equal to that of the signal from JTAG controller 130.

Figure 6:
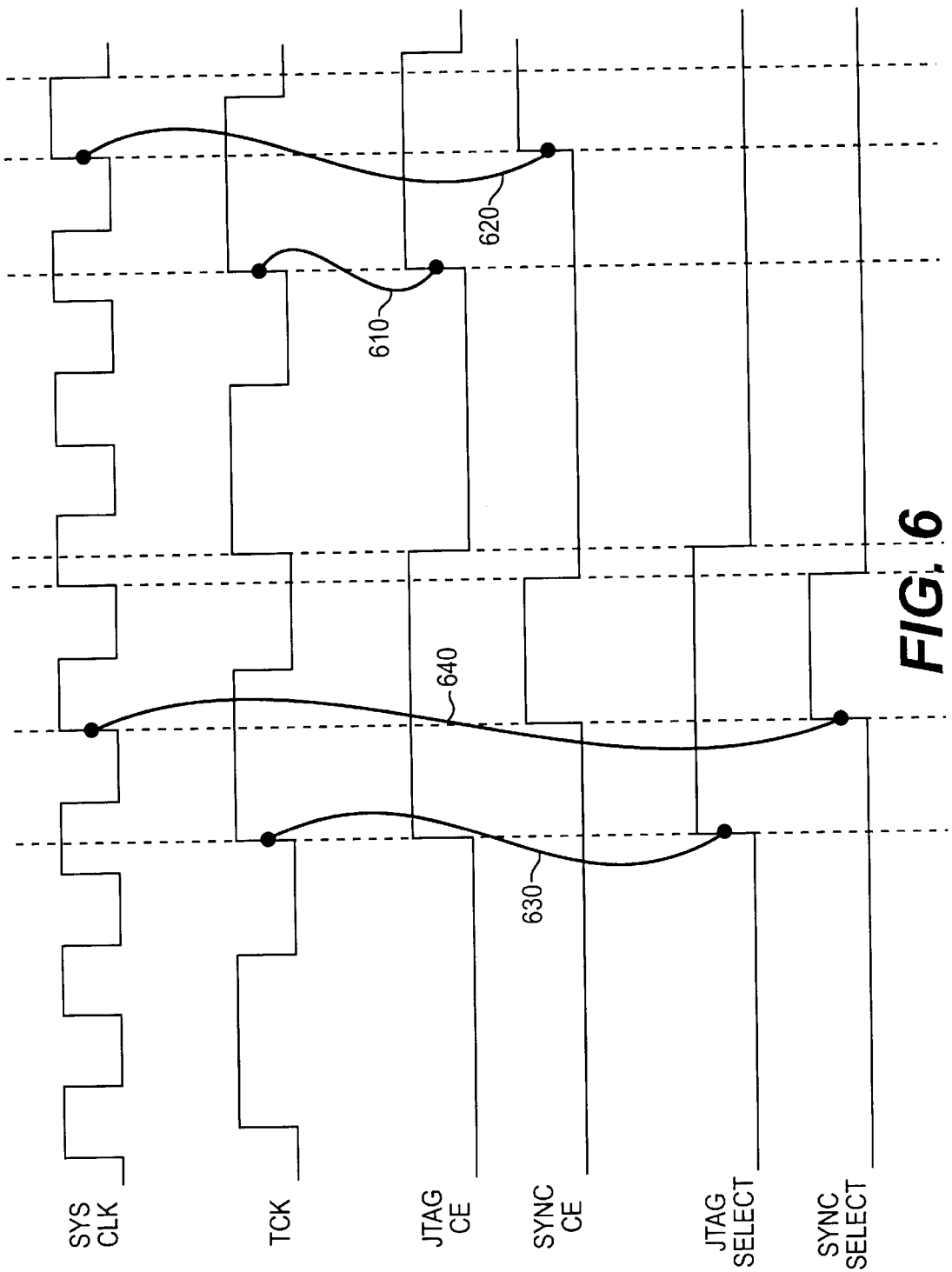
FIG. 6 is timing diagram depicting signals associated with synchronizing circuit 140 shown in FIG. 5.

FIG. 6 is timing diagram depicting signals in reference to synchronizing circuits 142 and 144 implemented as shown in FIG. 5. The signals shown in FIG. 6 correspond to those shown in FIG. 4. As explained in reference to FIG. 4, the JTAG CE and JTAG SELECT signals are synchronized with TCK (as shown for example at 610 and 630, respectively). FIG. 6 also demonstrates that the outputs of synchronizing circuits 142 and 144 (shown in detail in FIG. 5) are, respectively, either a Select signal (SYNC SELECT) or a clock-enable signal (SYNC CE) that is synchronized with system clock 135 (as shown for example at 620 and 640, respectively) and that operates at the JTAG SELECT or JTAG CE frequency, respectively.

C. Architectural Operation

Figure 7:
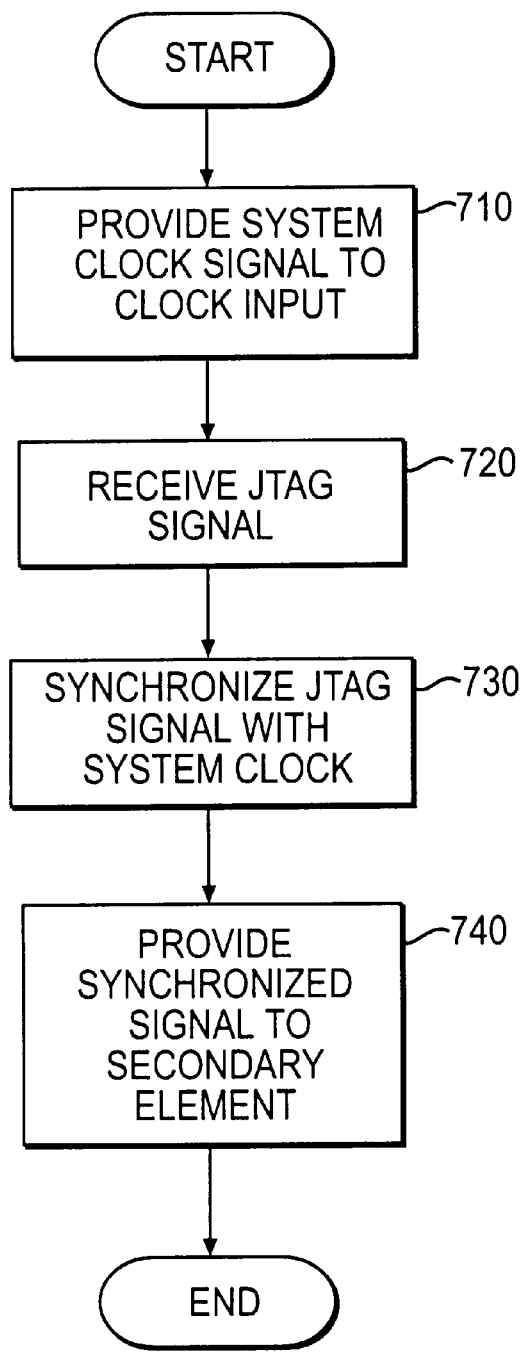
FIG. 7 is a flow diagram of a method of synchronizing an external clock to a system clock and controlling skew associated with the external clock.

FIG. 7 is a flow diagram of a method for synchronizing an external clock to a system clock and controlling skew associated with the external clock, consistent with the invention, and is described in reference to system 100 shown in FIG. 1. The system clock signal, which is skew-controlled, is provided as the clock input to secondary elements 155, 160, and 165 (step 710).

System 100 receives a signal from JTAG controller 130 (step 720). This maybe, for example, a signal to scan in data to the first secondary element in the chain (i.e., a Scan In signal), a signal to sample data from a preceding secondary element (i.e., a Select signal), or a signal to enable a secondary element (i.e., a clock-enable signal).

System 100 synchronizes the signal from JTAG controller 130 with system clock 135 by using synchronizing circuits 140, 142, or 144, or a combination thereof (step 730). If the signal from JTAG controller 130 is a Scan In signal, system 100 synchronizes it with system clock 135 by using synchronizing circuit 140. If the signal from JTAG controller 130 is a Select signal, system 100 synchronizes it with system clock 135 by using synchronizing circuit 142. If the signal from JTAG controller 130 is a clock-enable signal, system 100 synchronizes it with system clock 135 by using synchronizing circuit 144. As explained above, synchronizing circuits 140, 142, and 144 may be implemented using, for example, the circuits shown in FIGS. 3 and 5.

The synchronized signal output from synchronizing circuit 140 is provided as an input to a secondary element, such as secondary element 155 (step 740). If the synchronized signal is based on a Scan In signal from JTAG controller 130, it is provided to the S input of secondary element 155. If the synchronized signal is based on a Select signal from JTAG controller 130, it is provided to the Select input of secondary element 155. If the synchronized signal is based on a clock-enable signal from JTAG controller 130, it is provided to the CE input of secondary element 155.

The process described in reference to FIG. 7 eliminates clock skew by using the skew-controlled system clock signal as the clock input of the secondary element. This obviates the need for a separate, skew-controlled TCK or JTAG signal. Furthermore, the process described synchronizes the secondary element with the system clock signal and operates at the frequency of the TCK or JTAG signal.

D. Conclusion

As described in detail above, methods and apparatus consistent with the invention provide a way to drive a storage element at an external clock rate that is synchronized with the system clock and that does not suffer from clock skew problems. The foregoing description of an implementation of the invention has been presented for purposes of illustration and description, and therefore is not exhaustive and does not limit the invention to the precise form disclosed. Modifications and variations are possible in light of the above teachings or may be acquired from practicing the invention. For example, the description above is based on the JTAG standard, but it may be used with other standards. Similarly, the description above shows two embodiments of synchronizing circuits that could be used, but other forms may be used. The scope of the invention is defined by the claims and their equivalents.

What is claimed is:

1. A method of driving a storage element based on unsynchronized external signals that are not skew-controlled, in an environment having a synchronized, skew-controlled system clock signal, comprising:
   receiving an external clock-enable signal;
   synchronizing the external clock-enable signal with the system clock signal to create a synchronized CE signal;
   transmitting the synchronized CE signal to a clock-enable input of the storage element; and
   receiving the system clock signal at a clock input of the storage element.

2. The method of claim 1, further comprising:
   receiving an external select signal;
   synchronizing the external select signal with the system clock signal to create a synchronized select signal; and
   transmitting the synchronized select signal to a select input of the storage element.

3. The method of claim 1, wherein the synchronizing step comprises the substeps of:
   performing a logical AND operation between the external CE signal and an external clock signal to create a first output;
   transmitting the first output to a data input of a first edge-triggered storage element;
   receiving the system clock signal at a clock input of the first edge-triggered storage element;
   generating a second output from the first edge-triggered storage element based on the first output and the system clock signal;
   transmitting the second output to a data input of a second edge-triggered storage element;
   receiving the system clock signal at a clock input of the second edge-triggered storage element;
   generating a third output from the second edge-triggered storage element based on the second output and the system clock signal; and
   performing a logical AND operation between the second and third outputs.

4. A method of driving an edge-triggered flip flop based on JTAG signals that are not skew-controlled, in an environment having a synchronized, skew-controlled system clock signal, comprising:
   receiving a JTAG clock-enable signal;
   synchronizing the JTAG CE signal with the system clock signal to create a JTAG CE signal that is synchronized to the system clock signal;
   transmitting the synchronized JTAG CE signal to a clock-enable input of the flip flop; and
   receiving the system clock signal at a clock input of the flip flop.

5. A method for using JTAG signals to access data noninvasively from an edge-triggered primary storage element that operates in an integrated circuit having a synchronized, skew-controlled system clock signal, comprising:
   receiving an output of the primary storage element as an input to a secondary storage element;
   receiving a JTAG CE signal;
   synchronizing the JTAG CE signal with the system clock signal to create a synchronized JTAG CE signal;
   transmitting the synchronized JTAG CE signal to a clock-enable input of the secondary storage element; and
   receiving the system clock signal at a clock input of the secondary storage element.

6. The method of claim 5, further comprising:
   receiving a JTAG select signal;
   synchronizing the JTAG select signal with the system clock to create a synchronized JTAG select signal; and
   receiving the synchronized JTAG select signal at a select input of the secondary storage element.

7. An apparatus for driving a storage element based on unsynchronized external signals that are not skew-controlled, in an environment having a synchronized, skew-controlled system clock signal, comprising:
   means for receiving an external clock-enable signal;
   means for synchronizing the external clock-enable signal with the system clock signal to create a synchronized CE signal;
   means for transmitting the synchronized CE signal to a clock-enable input of the storage element; and
   means for receiving the system clock signal at a clock input of the storage element.

8. The apparatus of claim 7, further comprising:
   means for receiving an external select signal;
   means for synchronizing the external select signal with the system clock signal to create a synchronized select signal; and
   means for transmitting the synchronized select signal to a select input of the storage element.

9. The apparatus of claim 7, wherein the means for synchronizing comprises:
   means for performing a logical AND operation between the external CE signal and an external clock signal to create a first output;
   means for transmitting the first output to a data input of a first edge-triggered storage element;

means for receiving the system clock signal at a clock input of the first edge-triggered storage element;

means for generating a second output from the first edge-triggered storage element based on the first output and the system clock signal;

means for transmitting the second output to a data input of a second edge-triggered storage element;

means for receiving the system clock signal at a clock input of the second edge-triggered storage element;

means for generating a third output from the second edge-triggered storage element based on the second output and the system clock signal; and a means for performing a logical AND operation between the second and third outputs.

10. An apparatus for driving an edge-triggered flip flop based on JTAG signals that are not skew-controlled, in an environment having a synchronized, skew-controlled system clock signal, comprising:

means for receiving a JTAG clock-enable signal;

means for synchronizing the JTAG CE signal with the system clock signal to create a JTAG CE signal that is synchronized to the system clock signal;

means for transmitting the synchronized JTAG CE signal to a clock-enable input of the flip flop; and means for receiving the system clock signal at a clock input of the flip flop.

11. An apparatus for using JTAG signals to access data noninvasively from an edge-triggered primary storage element that operates in an integrated circuit having a synchronized, skew-controlled system clock signal, comprising:

means for receiving an output of the primary storage element as an input to a secondary storage element;

means for receiving a JTAG CE signal;

means for synchronizing the JTAG CE signal with the system clock signal to create a synchronized JTAG CE signal;

means for transmitting the synchronized JTAG CE signal to a clock-enable input of the secondary storage element; and means for receiving the system clock signal at a clock input of the secondary storage element.

12. The apparatus of claim 11, further comprising:

means for receiving a JTAG select signal;

means for synchronizing the JTAG select signal with the system clock to create a synchronized JTAG select signal; and means for receiving the synchronized JTAG select signal at a select input of the secondary storage element.

13. An apparatus for driving an edge-triggered storage element based on unsynchronized external signals that are not skew-controlled, in an environment having a synchronized, skew-controlled system clock signal, comprising:

a first synchronizing circuit having a first input connected to an external clock-enable signal, a second input connected to the system clock signal, and an output; and an edge-triggered storage element having a clock-enable input connected to the output of the first synchronizing circuit, a clock input connected to the system clock signal, and an output.

14. The apparatus of claim 13, further comprising a second synchronizing circuit having a first input connected to an external select signal, a second input connected to the system clock signal, and an output connected to a select input of the edge-triggered storage element.

15. The apparatus of claim 13, wherein the storage element comprises:

a logic AND element having a first input connected to the output of the first synchronizing circuit, a second input connected to the system clock signal, and an output; and a flip flop having a clock input connected to an output of the logic AND element.

16. The apparatus of claim 15, wherein the storage element further comprises a multiplexor having a first input connected to an output of a primary storage element, a second input connected to an output of a second secondary storage element, and a select input connected to the output of the synchronizing circuit.

17. The apparatus of claim 13, wherein the external signals comprise JTAG signals.

18. The apparatus of claim 13, wherein the storage element further comprises a mux-2 D-type flip flop with clock enable.

19. The apparatus of claim 13, wherein the synchronizing circuit comprises:

a first logic AND element having a first input connected to the external CE signal, a second input connected to an external clock signal, and an output;

a first storage element having a clock input connected to the system clock signal, a data input connected to the output of the first logic AND element, and an output;

a second storage element having a clock input connected to the system clock signal, a data input connected to the output of the first storage element, an output, and an inverted output; and a logic AND element having a first input connected to the output of the first storage element, a second input connected to the inverted output of the second storage element, and an output.

20. The apparatus of claim 13, wherein the synchronizing circuit comprises:

a first storage element having a clock input connected to the system clock signal, a data input connected to the external signal, and an output;

a second storage element having a clock input connected to the system clock signal, a data input connected to the output of the first storage element, an output, and an inverted output; and a logic AND element having a first input connected to the output of the first storage element, a second input connected to the inverted output of the second storage element, and an output.

21. An apparatus for using unsynchronized external signals that are not skew-controlled to drive a storage element operating in an environment having a synchronized, skew-controlled system clock signal, comprising:

a synchronizing circuit having a first input connected to an external clock-enable signal, a second input connected to the system clock signal, and an output;

a logic AND element having a first input connected to the output of the synchronizing circuit, a second input connected to the system clock signal, and an output; and a storage element having a clock input connected to the output of the logic AND element.

22. A system for driving an edge-triggered secondary storage element based on unsynchronized external signals that are not skew-controlled, in an environment having a synchronized, skew-controlled system clock signal, comprising:

a primary storage element that stores data and has an output;

an edge-triggered secondary storage element having an input connected to the output of the primary storage element, a clock input connected to the system clock, and a clock-enable input; and a synchronizing circuit having a first input connected to an external clock-enable signal, a second input connected to the system clock signal, and an output connected to the clock-enable input of the edge-triggered secondary storage element.

* * * * *

UNITED STATES PATENT AND TRADEMARK OFFICE
CERTIFICATE OF CORRECTION

PATENT NO. : 6,185,711 B1
DATED : February 6, 2001
INVENTOR(S) : Arthur T. Leung and Dale Greenley Page 1 of 1

It is certified that error appears in the above-identified patent and that said Letters Patent is hereby corrected as shown below:

Claim 9, column 9,
Line 14, before "means for performing" delete "a".

Signed and Sealed this

Twenty-fifth Day of September, 2001

Attest:

*Nicholas P. Godici*

NICHOLAS P. GODICI
*Acting Director of the United States Patent and Trademark Office*

*Attesting Officer*